United States Patent [19]

Hafner

[11] Patent Number: 4,706,159
[45] Date of Patent: Nov. 10, 1987

[54] MULTIPLE POWER SUPPLY OVERCURRENT PROTECTION CIRCUIT

[75] Inventor: Warren G. Hafner, Lake Carmel, N.Y.

[73] Assignee: Pitney Bowes Inc., Stamford, Conn.

[21] Appl. No.: 710,795

[22] Filed: Mar. 12, 1985

[51] Int. Cl.$^4$ .............................................. H02H 9/02
[52] U.S. Cl. ....................................... 361/93; 361/87; 323/279; 323/268
[58] Field of Search ................. 361/87, 100, 101, 88, 361/91; 323/271, 282, 284, 279, 268; 307/200 B, 350, 296 R

[56] References Cited

U.S. PATENT DOCUMENTS

| | | | |
|---|---|---|---|
| 3,305,764 | 2/1967 | Todd | 323/279 |
| 3,534,249 | 10/1970 | Neill et al. | 323/279 |
| 3,571,604 | 3/1971 | LaPorta et al. | 323/268 X |
| 3,749,936 | 7/1973 | Bell | 307/200 B X |
| 3,968,382 | 7/1976 | Tsurushima | 361/87 |
| 4,148,088 | 4/1979 | Meroni | 361/101 X |
| 4,189,670 | 2/1980 | Tanahashi | 323/268 X |
| 4,228,477 | 10/1980 | Claus et al. | 361/87 |
| 4,322,639 | 3/1982 | Yamashiro | 307/350 |
| 4,359,650 | 11/1982 | Newcomb | 307/350 X |
| 4,456,833 | 6/1984 | Traub et al. | 323/268 X |
| 4,535,378 | 9/1985 | Endo | 361/87 X |
| 4,543,494 | 9/1985 | Wakimoto | 307/200 B |

FOREIGN PATENT DOCUMENTS 978128  11/1982  U.S.S.R. .............................. 323/271

*Primary Examiner*—J. R. Scott
*Assistant Examiner*—A. Jonathan Wysocki
*Attorney, Agent, or Firm*—Michael J. DeSha; David E. Pitchenik; Melvin J. Scolnick

[57] ABSTRACT

A short circuit protection circuit and associated method is provided, for a device with a first and second power supply. The circuit comprises a pair of switches connected to the respective power supplies, a current sensing element connected to each switch and an output buffer circuit connected to each switch for preventing either power supply from being shorted. The circuitry utilizes advantageously integrated circuit technology. Through the use of the circuitry the power supplies are effectively removed from the output buffer when excessive current is sensed.

10 Claims, 1 Drawing Figure

MULTIPLE POWER SUPPLY OVERCURRENT PROTECTION CIRCUIT

FIELD OF THE INVENTION

The present invention relates to a short circuit protection circuit, and more particularly to a short circuit protection circuit for an integrated circuit having a digital output.

BACKGROUND OF THE INVENTION

In various electronic systems employing integrated circuit chips, the integrated circuit chip may be damaged as a result of excessive current flow if the output pin of the chip is shorted to the positive or negative power supply terminal.

SUMMARY OF THE INVENTION

It is an object of the present invention to provide a short circuit protection circuit for integrated circuits.

It is a further object of the present invention to provide a short circuit protection circuit to protect an integrated circuit chip from damage when its output pin is shorted to either power supply.

It is a still further object of the present invention to provide a short circuit protection circuit which may be integrated with an integrated circuit chip as part of an output buffer.

It is a still further object of the present invention to provide an active short circuit protection circuit which provides a quick response.

It is a still further object of the present invention to provide a short circuit protection circuit which may be readily and reliably implemented as part of an integrated circuit chip.

Briefly, in accordance with the present invention, a circuit for preventing a short circuit in a device which has a first and second power supply is provided, comprising a first switch means for receiving the first supply voltage, first current sense means electrically coupled to the first supply switch means, second switch means for receiving the second supply voltage, second current sense means electrically coupled to the second supply switch means, and an output buffer electrically connected to the first and second switch means. Through the use of this circuitry if a short circuit is present between a power supply and the output buffer, the power supply is effectively removed from the output buffer.

Other objects, aspects and advantages of the present invention should be understood from the detailed description, considered in conjunction with the drawings, as follows.

BRIEF DESCRIPTION OF THE DRAWINGS

A schematic circuit diagram of a short circuit protection circuit in accordance with the present invention is illustrated in the drawing.

DETAILED DESCRIPTION

Figure 1:
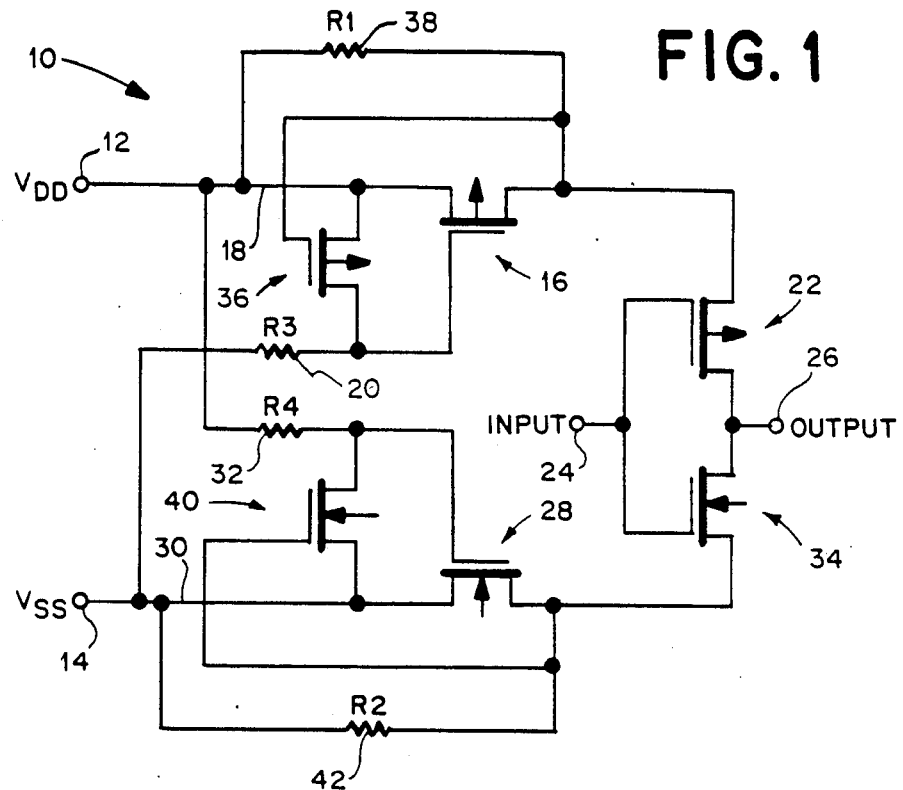

Referring to the drawing, a short circuit protection circuit in accordance with the present invention is illustrated generally at 10. A first voltage supply terminal 12 receives a positive supply voltage VDD for an integrated circuit chip (not shown). The supply voltage $V_{DD}$ may be, e.g., 5 V. A second voltage supply terminal 14 receives a supply voltage $V_{SS}$ for the integrated circuit chip (not shown). The supply voltage $V_{SS}$ may be, e.g., ground.

A first input field effect transistor in the form of a P-channel MOSFET 16 has its source terminal electrically coupled to the first voltage supply terminal 12 over line 18 and its gate terminal coupled to the second voltage supply terminal 14 through a biasing resistor 20 ($R_3$). The drain terminal of the MOSFET 16 is electrically connected to the source terminal of a first output field effect transistor in the form of a P-channel MOSFET 22. The gate terminal of the M0SFET 22 is coupled to an input terminal 24 for receiving a digital input signal. The drain terminal of the MOSFET 22 is coupled to an output terminal 26 which normally provides a digital output.

A second input field effect transistor in the form of an N-channel MOSFET 28 has its source terminal coupled to the second voltage supply terminal 14 through line 30 and its gate terminal coupled to the first voltage supply terminal 12 through biasing resistor 32 ($R_4$). The drain terminal of the MOSFET 28 is electrically connected to the source terminal of a second output field effect transistor in the form of an Nchannel MOSFET 34. The gate terminal of the MOSFET 34 is coupled to the input terminal 24 and the drain terminal of the output N-channel MOSFET 34 is coupled to the output terminal 26. MOSFETs 22 and 34 act as an output buffer which accepts small signals at input 24 and amplifies them at out 34.

A first deactivating field effect transistor in the form of a P-channel MOSFET 36 has its drain terminal coupled to the gate terminal of the MOSFET 16, and to one end of the biasing resistor 20, and its source terminal coupled to line 18, and therefore to the first voltage supply terminal 12, as well as to the source terminal of MOSFET 16. The gate terminal of the MOSFET 36 is coupled to the first voltage supply terminal 12 through a biasing resistor 38 ($R_1$) and to the drain terminal of MOSFET 16, and therefore to the source terminal of the MOSFET 22.

A second deactivating field effect transistor in the form of an N-channel MOSFET 40 has its drain terminal coupled to the gate terminal of the MOSFET 28 and to one end of the biasing resistor 32 ($R_4$), and its source terminal coupled to line 30, and therefore to the second voltage supply terminal 14, as well as to the source terminal of the MOSFET 28. The gate terminal of the MOSFET 40 is coupled to the second voltage supply terminal 14 through a biasing resistor 42 ($R_2$) and to the drain terminal of the MOSFET 28 and therefore to the source terminal of the MOSFET 34. MOSFETs 36 and 40 act as current sensing switches in their respective current paths.

The P-channel MOSFET 22 and the N-channel MOSFET 34 are connected in a push-pull configuration with their gate terminals connected to the input terminal 24 and their drain terminals connected to the output terminal 26.

In operation, when the output terminal 26 is shorted to $V_{SS}$ a direct short exists for $V_{DD}$ through the P-channel MOSFET 16 and the P-channel MOSFET 22, when input 24 is low, to the output terminal 26. Likewise, when the output terminal 26 is shorted to $V_{DD}$, and a direct short exists from $V_{SS}$ through the N-channel MOSFET 28 and the N-channel M0SFET 34, when input 24 is high, to the output terminal 26.

With the output terminal 26 shorted to $V_{SS}$, the voltage drop across MOSFET 16 and MOSFET 22 increases. Likewise, if the output terminal 26 is shorted to $V_{DD}$, the voltage drop across MOSFET 28 and MOSFET 34 increases. As the current through MOSFET 16 or MOSFET 28 increases, the voltage drop across MOSFET 16 or MOSFET 28 increases due to its internal resistance and the increase in temperature. When the voltage at the drain terminal of the MOSFET 16 reaches the threshold value of the MOSFET 36, the MOSFET 36 begins to turn on. That is, MOSFET 36 begins to turn on as a result of a lower positive voltage being applied to its gate terminal from the drain terminal of the MOSFET 16. Likewise, when the voltage at the drain terminal of the MOSFET 28 reaches the threshold value of the MOSFET 40, the MOSFET 40 begins to turn on. That is, MOSFET 40 begins to turn on as a result of a more positive voltage being applied to its gate terminal from the drain terminal of the MOSFET 28.

When MOSFET 36 begins to turn on, MOSFET 16 begins to turn off since a higher voltage is applied to its gate terminal through MOSFET 36. Likewise, when MOSFET 40 begins to turn on, MOSFET 28 begins to turn off since less voltage is applied to its gate terminal through biasing resistor 32. This effect continues until MOSFET 16, or MOSFET 28, is completely off. With MOSFET 16 or MOSFET 28 off, any current flow from the voltage supply terminals 12 or 14 to the output terminal 26 is inhibited or prevented by the effective open circuits presented by MOSFET 16 and MOSFET 28, with the exception of the small amount of leakage current through resistors 38 and 42. Resistors 20 and 32 bias the drain terminals of MOSFETs 36 and 40, respectively, and regulate the voltage to the gate terminals of MOSFETs 16 and 28, respectively, to turn them on during normal operation of the circuit 10 with the output terminal 26 providing a digital output (inverted) in response to the presence of digital signal at the input terminal 24. That is, once the short circuit condition is eliminated, the output terminal 26 will return to normal digital operation. The push-pull configuration of the MOSFETs 22 and 34 causes the circuit 10 to function as an inverter during normal operation. Specifically, a high digital signal present at the input terminal 24 will provide a low digital output at the output terminal 26 through MOSFET 34 which is turned on and shorts the output terminal 26 to ground, $V_{SS}$. Conversely, a low digital signal present at the input terminal 24 will provide a high output signal at the output terminal 26 through MOSFET 22 which is turned on and connects the output terminal to the positive voltage supply, $V_{DD}$, e.g., 5 V.

It should be understood by those skilled in the art that various modifications may be made in the present invention without departing from the spirit and scope thereof, as described in the specification and defined in the appended claims.

What is claimed is:

1. A circuit for preventing a short circuit in a device which has a first and second power supply; the circuit comprising
    a first switch means connected to the first power supply;
    a first voltage sense means connected to the first switch means, a second switch means connected to the second power supply;
    a second voltage sense means connected to the second switch means;
    first biasing means for coupling the second power supply voltage to the first switch means;
    second biasing means for coupling the first power supply voltage to the second switch means; and
    an output buffer which is electrically connected to the first and second switch means, the first sense means after sensing an excessive voltage disconnecting the first power supply from the buffer, the second sense means after sensing an excessive voltage disconnecting the second power supply from the buffer.

2. The circuit recited in claim 1, including:
third and fourth biasing means for biasing the output buffer.

3. The circuit recited in claim 1, wherein:
the first and second switch means, the output buffer, and the first and second voltage sense means include field effect transistors.

4. The circuit recited in claim 3, wherein:
said field effect transistors are MOSFETs.

5. The circuit recited in claim 4, wherein:
said output buffer include MOSFETs electrically coupled in a push-pull arrangement with their gate terminals coupled to an input terminal and their drain terminals coupled to an output terminal;
said first switch means has it source terminal coupled to the first power supply, its gate terminal coupled to the second power supply through a first biasing resistor and to the drain terminal of the first voltage sense means, and its drain terminal coupled to a source terminal of the output buffer and to the gate terminal of said first voltage sense means;
said second switch means has its source terminal coupled to the second power supply, its gate terminal coupled to the first power supply through a second biasing resistor and to the drain terminal of said second voltage sense means, and its drain terminal coupled to a second source terminal of the output buffer and to a gate terminal of said second voltage sense means;
the first voltage sense means further having its source terminal coupled to the first power supply and its gate terminal coupled to the first power supply terminal through a third biasing resistor;
said second voltage sense means further having its source terminal coupled to the second power supply and its gate terminal coupled to the second power supply through a fourth biasing resistor.

6. A short circuit protection circuit, comprising:
a first supply switch means for receiving a first supply voltage;
first output switch means electrically coupled to said first supply switch means;
second supply switch means for receiving a second supply voltage;
second output switch means electrically coupled to said second input switch means;
said first and second output switch means being electrically connected to an output terminal;
first deactivating switch means electrically connected to said first supply switch means for turning said first supply switch means off in response to an excessive voltage generated by excessive current from the first power supply;
second deactivating switch means electrically connected to said second supply switch means for turning said second supply switch means off in response to an excessive voltage generated by excessive current from the second power supply;

first biasing means for coupling the second supply voltage to the first switch means; and second biasing means for coupling the first supply voltage to the second switch means.

7. The short circuit protection circuit recited in claim 6, including:

third biasing means for biasing said first output switch means; and fourth biasing means for biasing said second output switch means.

8. The short circuit protection circuit recited in claim 6, wherein:

said first and second supply switch means, said first and second output switch means and said first and second deactivating switch means include field effect transistors.

9. The short circuit protection circuit recited in claim 8, wherein:

said field effect transistors are MOSFETs.

10. The short circuit protection circuit recited in claim 9, wherein:

said first and second output switch means include MOSFETs electrically coupled in a push-pull arrangement with their gate terminals coupled to an input terminal and their drain terminals coupled to an output terminal;

said first supply switch means MOSFET has its source terminal coupled to the first supply voltage, its gate terminal coupled to the second supply voltage through a first biasing resistor and to the drain terminal of said first deactivating switch means MOSFET, and its drain terminal coupled to the source terminal of said first output switch means MOSFET and to the gate terminal of the first deactivating switch means MOSFET;

said second supply switch means MOSFET has its source terminal coupled to the second supply voltage, its gate terminal coupled to the first supply voltage through a second biasing resistor and to the drain terminal of said second deactivating switch means MOSFET, and its drain terminal coupled to the source terminal of said second output switch means MOSFET and to the gate terminal of said second deactivating switch means MOSFET;

said first deactivating switch means MOSFET further having its source terminal coupled to the first supply voltage and its gate terminal coupled to the first supply voltage terminal through a third biasing resistor;

said second deactivating switch means MOSFET further having its source terminal coupled to the second supply voltage and its gate terminal coupled to the second supply voltage through a fourth biasing resistor.

* * * * *